(12) United States Patent
Gaynes et al.

(10) Patent No.: US 9,412,891 B2
(45) Date of Patent: Aug. 9, 2016

(54) THERMAL RECEIVER FOR HIGH POWER SOLAR CONCENTRATORS AND METHOD OF ASSEMBLY

(71) Applicant: International Business Machines Corporation, Armonk, NY (US)

(72) Inventors: Michael A. Gaynes, Vestal, NY (US); Peter D. Kirchner, Putnam Valley, NY (US); Yves C. Martin, Ossining, NY (US); Naim Moumen, Walden, NY (US); Dhirendra M. Patel, Edison, NJ (US); Robert L. Sandstrom, Chestnut Ridge, NY (US); Theodore G. van Kessel, Millbrook, NY (US); Brent A. Wacaser, Garrison, NY (US); Hussam Khonkar, Riyadh (SA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 808 days.

(21) Appl. No.: 13/716,685

(22) Filed: Dec. 17, 2012

(65) Prior Publication Data
US 2014/0166070 A1    Jun. 19, 2014

(51) Int. Cl.
*H01L 31/024* (2014.01)
*H01L 31/052* (2014.01)
*H01L 31/048* (2014.01)
(Continued)

(52) U.S. Cl.
CPC ............ *H01L 31/052* (2013.01); *H01L 31/024* (2013.01); *H01L 31/048* (2013.01); *H01L 31/0543* (2014.12); *H02S 40/42* (2014.12); *Y02E 10/40* (2013.01); *Y02E 10/50* (2013.01); *Y02E 10/52* (2013.01)

(58) Field of Classification Search
CPC .... H01L 31/024; H01L 31/048; H01L 31/052
See application file for complete search history.

(56) References Cited

U.S. PATENT DOCUMENTS

| 2003/0116184 A1 | 6/2003 | Derby-Lewis |
| 2008/0135086 A1 | 6/2008 | Corrales |
| 2009/0199891 A1 | 8/2009 | Hering et al. |

(Continued)

FOREIGN PATENT DOCUMENTS

| CN | 202058773 U | 11/2011 |
| EP | 2395563 A1 | 12/2011 |

(Continued)

OTHER PUBLICATIONS

Anonymous Authors, "Concentrated Solar Power System fir Intercooled Recuperated Gas Turbine Combined Cycle," ip.com No. IPCOM000219579D; ip.com Electronic Publication: Jul. 9, 2012; 6 pages.

(Continued)

*Primary Examiner* — Golam Mowla
(74) *Attorney, Agent, or Firm* — Cantor Colburn LLP; Vazken Alexanian

(57) ABSTRACT

A device for dissipating heat from a photovoltaic cell is disclosed. A first thermally conductive layer receives heat from the photovoltaic cell and reduces a density of the received heat. A second thermally conductive layer conducts heat from the first thermally conductive layer to a surrounding environment. An electrically isolating layer thermally couples the first thermally conductive layer and the second thermally conductive layer.

17 Claims, 4 Drawing Sheets

(51) Int. Cl.
*H02S 40/42* (2014.01)
*H01L 31/054* (2014.01)

(56) References Cited

U.S. PATENT DOCUMENTS

| | | |
|---|---|---|
| 2009/0314333 A1 | 12/2009 | Shepard |
| 2010/0012171 A1 | 1/2010 | Ammar |
| 2010/0037935 A1 | 2/2010 | Vaid et al. |
| 2011/0088756 A1* | 4/2011 | Fujii .................. H01L 31/048 136/251 |
| 2011/0201157 A1 | 8/2011 | Lin et al. |
| 2011/0204408 A1 | 8/2011 | McKenzie et al. |
| 2011/0240098 A1 | 10/2011 | Corrales et al. |
| 2012/0097247 A1 | 4/2012 | Gordon |
| 2012/0138145 A1 | 6/2012 | Gaynes et al. |
| 2012/0312351 A1 | 12/2012 | Knox |

FOREIGN PATENT DOCUMENTS

| | | |
|---|---|---|
| JP | 2011003896 A | 1/2011 |
| WO | 2005036616 A1 | 4/2005 |
| WO | WO2009061493 A1 | 5/2009 |
| WO | WO2012061144 A2 | 5/2012 |

OTHER PUBLICATIONS

M. Milbourne, "Silver Mirror Baking," ip.com; ip.com No. IPCOM000212145D; ip.com Electronic Publication: Nov. 2, 2011; Copyright SolFocus, Inc.; 4 pages.

PCT International Search Report and Written Opinion; International Application No. PCT/US13/68393; International Filing Date: Nov. 5, 2013; Date of Mailing: Apr. 16, 2014; pp. 1-23.

* cited by examiner

US 9,412,891 B2

THERMAL RECEIVER FOR HIGH POWER SOLAR CONCENTRATORS AND METHOD OF ASSEMBLY

BACKGROUND

The present disclosure relates to solar energy, and more specifically, to dissipating heat from photovoltaic cells illuminated by concentrated solar rays.

Solar power concentrators are often used in photovoltaic systems to increase an output of the photovoltaic cells. New solar concentrators are able to increase a concentration of incident solar energy by up to and beyond 2000 times. A consequence of this concentration is the production of high levels of heat which raises the temperatures of solar cells. However, solar cells must be operated at temperatures that are typically less than about 110° C. in order to prevent heat damage. Another consequence of the solar concentration is a large current density. It is desired to couple this current to a load in a manner that offers as little electrical resistance as possible to avoid dissipating electrical energy as heat.

SUMMARY

According to one embodiment of the present disclosure, a device for dissipating heat from a photovoltaic cell includes: a first thermally conductive layer configured to receive heat from the photovoltaic cell and reduce a density of the received heat; a second thermally conductive layer configured to conduct heat from the first thermally conductive layer to a surrounding environment; and an electrically isolating layer configured to thermally couple the first thermally conductive layer and the second thermally conductive layer.

According to another embodiment of the present disclosure, a photovoltaic cell assembly includes: a photovoltaic cell; a first thermally conductive layer configured to receive heat from the photovoltaic cell and reduce a density of the received heat; a second thermally conductive layer configured to conduct heat from the first thermally conductive layer to a surrounding environment; and an electrically isolating layer configured to thermally couple the first thermally conductive layer and the second thermally conductive layer.

According to another embodiment of the present disclosure, a solar panel includes: a plurality of photovoltaic cell assemblies; at least one wire coupling the photovoltaic cell assemblies; wherein a photovoltaic cell assembly selected from the plurality of photovoltaic cell assemblies includes: a photovoltaic cell, a first thermally conductive layer configured to receive heat from the photovoltaic cell and reduce a density of the received heat, a second thermally conductive layer configured to conduct heat from the first thermally conductive layer to a surrounding environment, and an electrically isolating layer configured to thermally couple the first thermally conductive layer and the second thermally conductive layer.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The forgoing and other features, and advantages of the disclosure are apparent from the following detailed description taken in conjunction with the accompanying drawings in which:

DETAILED DESCRIPTION

Figure 1:
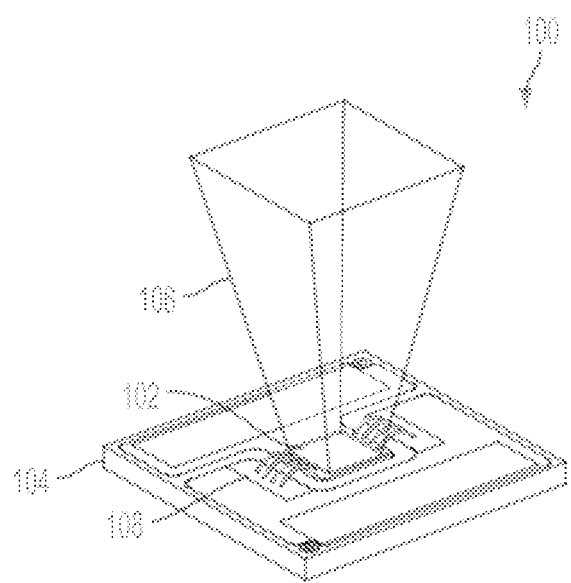
FIG. 1 shows a photovoltaic assembly according to an exemplary embodiment of the present disclosure.

FIG. 1 shows a photovoltaic assembly 100 according to an exemplary embodiment of the present disclosure. The exemplary photovoltaic assembly 100 includes an optical assembly 106 that is affixed to a front surface of a photovoltaic cell 102 for concentrating solar rays. In an exemplary embodiment, the optical assembly 106 provides a concentration of about 1600 times or greater than the incident solar concentration. In an exemplary embodiment, this level of solar concentration produces a large amount of heating at the photovoltaic cell 102. The photovoltaic cell 102 is coupled to a cell package 104 for dissipating heat from the photovoltaic cell 102. In an exemplary embodiment, a back surface of the photovoltaic cell 102 is directly soldered to the cell package 104 using a solder. The solder may include an 80/20 lead/tin solder or a low melt solder. Alternate solders usable for soldering the photovoltaic cell 102 and cell package 104 may include alloys containing at least one of lead, tin, copper, gallium, silver, manganese, magnesium, bismuth, indium, zinc and antimony, such as for example Sn—Ag—Cu, Sn—Ag—Cu—Zn and Sn—Ag—Cu—Mn. Alternately, the photovoltaic cell 102 may be coupled to the cell assembly 104 using a conductive particle infused polymer adhesive, such as silver paste. Wires 108 are bonded between the photovoltaic cell 102 and the cell package 104 to provide an electrical path for current produced at the photovoltaic cell 102. In an exemplary embodiment, the wires 108 may be bonded using a solder such as the exemplary solders listed above. In an alternate embodiment the cell is connected to the top surface conductors on the cell package using on of wire bonding and ribbon bonding methods where the wire and ribbon may comprise one of gold, silver, platinum, palladium, aluminum, silicon and copper.

Figure 2:
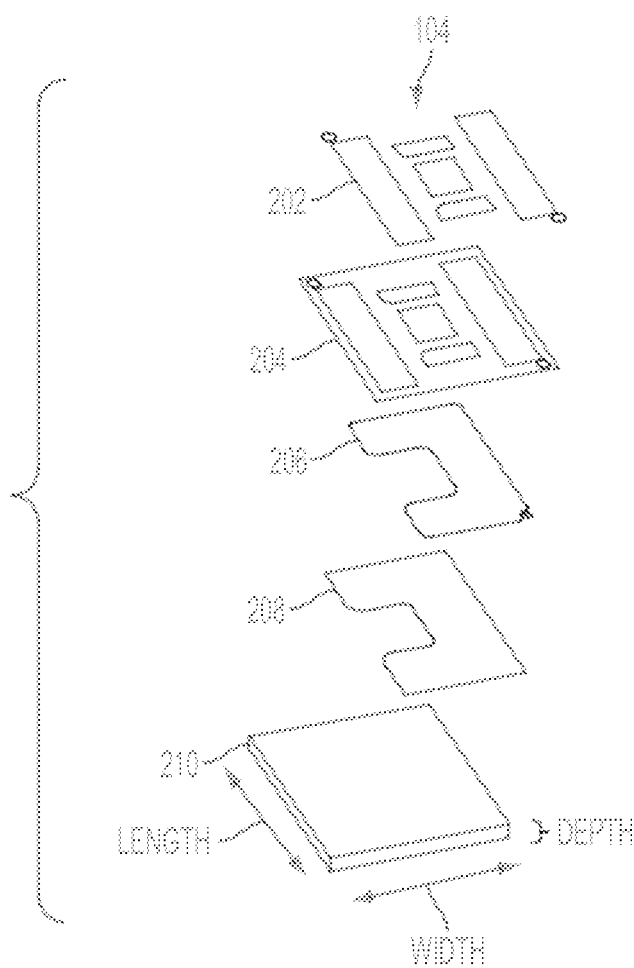
FIG. 2 shows an exploded view of an exemplary cell package of the photovoltaic assembly FIG. 1 in one embodiment of the present disclosure.

FIG. 2 shows an exploded view of an exemplary cell package 104 of FIG. 1 in one embodiment of the present disclosure. The exemplary cell package 104 includes a coating 202, a solder mask 204, a copper layer 206, a dielectric layer 208 and a substrate layer 210. In an exemplary embodiment, copper layer 206 and substrate layer 210 form electrodes coupled to the photovoltaic cell 102. In an exemplary embodiment, copper layer 206 forms an electrical circuit with the photovoltaic cell 102.

Coating 202 provides a top surface of the cell package and is in contact with the photovoltaic cell 102. Coating 202 provides a substantially corrosion resistant surface for wire bonding and may include at least one of gold, silver, nickel, zinc and tin. Solder mask 204 provides a second layer of the cell package 104 and includes an insulating material. The solder mask may include standard solder mask material such as, for example, an epoxy paint. The solder mask 204 may be applied via screen printing in an exemplary embodiment. The solder mask may have windows for wire bonding, strap bonding or strap welding of connections between the photovoltaic cell 102 and package electrodes (not shown) of the cell package 104. The solder mask 204 further includes windows allowing interconnecting wires (see FIG. 5) to be soldered to the package electrodes, thereby interconnecting a plurality of photovoltaic assemblies 100 to each other and/or to an external device. In exemplary embodiments, the interconnecting wires may be bonded between the photovoltaic cell 102 and the electrodes of the cell package 104 using gold wire bonding, ribbon bonding or strap welding, for example. Connective bonding material may include at least one of gold, silver, Invar, iron, copper and tin.

Copper layer 206 provides a third layer of the cell package 104 and is an electrically conductive layer that forms a second electrode of the photovoltaic cell 104. In alternate embodiments, the copper layer 206 may be made of any material that is electrically conductive. Copper layer 206 may be patterned using exemplary lithographic methods such as photolithography, screen printing, and ink jet printing, for example. After patterning, an etch process may be used to remove unwanted copper from the copper layer 206 to form a selected shape. In addition, the copper layer is selected to provide an electrically conductive channel for conducting current generated from the photovoltaic cell, for example, to the interconnecting wires. In various embodiments, the current densities are in a range from about 6.3 amps per square centimeter (amps/cm$^2$) to about 25.2 amp/cm$^2$. The copper layer 206 may be electrically coupled to an electrode of the photovoltaic cell 102 using a ribbon bond, a wire bond, etc.

Dielectric layer 208 provides a fourth layer of the cell package 104 that provides electrical isolation of the copper layer 206 from the underlying substrate layer 210. The dielectric layer 208 further allows heat transfer from the copper layer 206 to the substrate layer 210. In an exemplary embodiment, the dielectric layer 208 may include an FR4 matrix of glass fiber and epoxy that may be cured by thermal, chemical or ultraviolet methods.

Substrate layer 210 provides a fifth and bottom layer of the cell package 104 and may be a thick layer in comparison to layers 202-208. The substrate layer 210 may serve as both an electrode and a thermal conductor. Increasing the thickness d of the substrate layer 210 relative to the thicknesses of layers 202-208 increases an ability of the substrate layer 210 to spread the heat conducted to the substrate layer from the photovoltaic cell 104 via the layers 202-208. The substrate layer may have lateral dimensions of length and width. Increasing the size of the lateral dimensions may improve a thermal coupling of the substrate layer 210 to a backplane (see FIG. 4). The lateral dimension and thickness of the substrate layer may be selected to achieve a selected thermal performance (i.e., solar heat dissipation) of the cell package 104 and a selected operating temperature of the related photovoltaic assembly 100. In an exemplary embodiment, the substrate layer 210 is made of copper or other material selected to achieve high thermal conductivity. In alternate embodiments, layer 210 may include aluminum or at least one of copper, aluminum, iron, chrome, nickel, molybdenum, zinc and tin. In an embodiment in which a photovoltaic cell has a length and width of about 3.75 millimeters (mm), a length and width of the substrate layer 210 may be about 15 mm and the thickness may be about 1.5 mm.

Layers 206, 208 and 210 may be coupled to each other by pressure and heat to cure layer 208 to form a bond. In an exemplary embodiment, layers 206, 208 and 210 may be bonded to form a sheet that is then separated into individual substrates suitable for use in a selected cell package 104. The separated substrates may be patterned into individual substrate layers using printed circuit methods.

Figure 3:
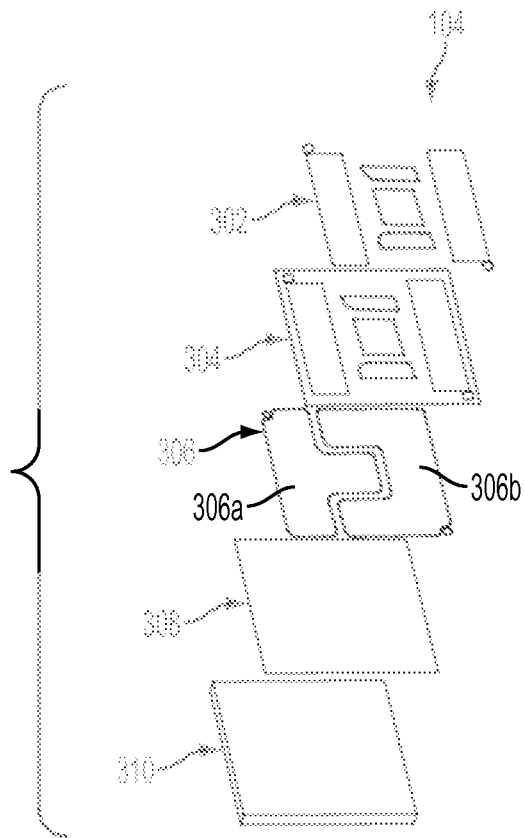
FIG. 3 shows an alternate embodiment of a cell package of the photovoltaic assembly of FIG. 1.

FIG. 3 shows a cell package 104 in an alternate embodiment. The alternate cell package 104 includes a coating 302, a solder mask 304, a copper layer 306, a dielectric layer 308 and a substrate layer 310. In the alternate embodiment, layer 306 includes both cell electrodes 306a and 306b coupled to the photovoltaic cell 102 and is made of thick copper that has a thickness that is substantially between about 20 microns and about 400 microns. The dimensions of the layer 306 are selected so as to be conducive to spreading heat laterally. Layer 308 is made thin in comparison to layer 208 of FIG. 2 to increase heat transfer between layer 306 and the substrate 310.

Figure 4:
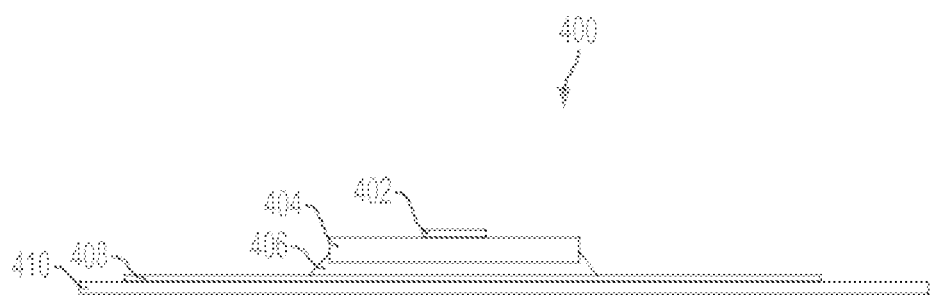
FIG. 4 shows a cross-sectional view of an exemplary photovoltaic assembly coupled to a backplane.

FIG. 4 shows a cross-sectional view 400 of an exemplary photovoltaic assembly coupled to a backplane 410. The photovoltaic assembly includes photovoltaic cell 402 mounted on an exemplary cell package 404. The cell package 404 is coupled to an insulation layer or layers 408 via a thermal adhesive 406 that allows heat transfer between the cell package 404 and the insulation layer or layers 408. The insulation layer or layers 408 may be a printable layer. In one embodiment, the insulation layer or layers 408 may be multi-layer insulators. The insulation layer or layer 408 may also include aluminum oxide, polymers, or other electrically resistive particles, etc.

In an exemplary embodiment, the thermal adhesive 406 may include a material having at least one of a high thermal conductivity, a high mechanical flexibility, an ability to cure at low temperatures, an ability to withstand operating temperatures in a range from about −40° C. to about 120° C., and an ability to adhere to the contacting faces of the cell package 404 and of the insulation layer or layers 408 providing electrical insulation. The thermal adhesive 406 may include, but is not limited to, SilCool™ TIA-0220 of Momentive Performance Materials, Inc. In an exemplary embodiment, the thermal adhesive 406 includes an insulating silicone adhesive. In alternate embodiments, the thermal adhesive 406 may include epoxy and acrylic adhesives. In another embodiment, the thermal adhesive 406 includes a polymer with thermally conductive particles embedded therein. Exemplary polymers may include at least one of silicone, acrylic and epoxy. Exemplary particles may include at least one of aluminum oxide, aluminum nitride and silicon dioxide. In an exemplary embodiment, the thermal adhesive 406 is compressed to a thin bond line of approximately 50 microns or less and is allowed to slightly extrude beyond the edges of the cell package 404.

The insulation layer 408 or layers reduces electrical conduction between the cell package 404 and the backplane 410, while allowing heat transfer therebetween. The insulation layer or layers 408 may be bonded to an aluminum backplane 410 prior to bonding the insulation layer or layers 408 to the cell package 404. The insulation layer or layers 408 may include an epoxy-based screen-printable material. In various embodiments, the insulation layer or layers 408 may include any electrically-insulating material with high dielectric strength, strong adhesion to the anodized aluminum of the backplane 410 and an ability to resist heat damage at temperatures in an operating range from about 85° C. to about 120° C. In an exemplary embodiment, the insulation layer or layers 408 may include TechniFlex by Technic Corp. and may be applied using screen printing methods on the backplane 410 to a thickness of about 15 microns. In alternative embodiments, the insulation layer or layers 408 may include, but is not limited to, paints, lacquers, powder coats, etc. Such materials in the alternative embodiment of the insulation layer or layers 408 may include at least one of polyester, polyurethane, polyester-epoxy, epoxy, acrylic and silicone.

The aluminum backplane 410 may include a sheet of anodized aluminum. In an exemplary embodiment, the backplane 410 includes a sheet of about 1.5 mm in thickness and an anodized layer thickness of about 10 microns. In various embodiments, the anodized layer may have a thickness that provides a protective layer to the aluminum surface as well as an electrical breakdown resistance. Electrical breakdown resistance is provided by the thermal adhesive 406, the insulation layer or layers 408 and the anodization of the backplane 410.

In an exemplary operation of the photovoltaic assembly, heat concentrated at the photovoltaic cell is transferred to the cell package 404. At the cell package 404, the heat is distributed in along lateral dimensions of the cell package at the copper substrate, such as substrate 210 in FIG. 2 or alternately substrate 310 in FIG. 3 in order to reduce an areal density of the heat by spreading the heat, in general along a lateral dimension of the substrate. Heat from the substrate 210 is transferred to the aluminum backplane 410 through the insulation layer 408. In various embodiments, the insulation layer 408 prevents current transfer between substrate 310 and the aluminum backplane 410 by providing a breakdown resistance to about 1700 volts or more.

Figure 5:
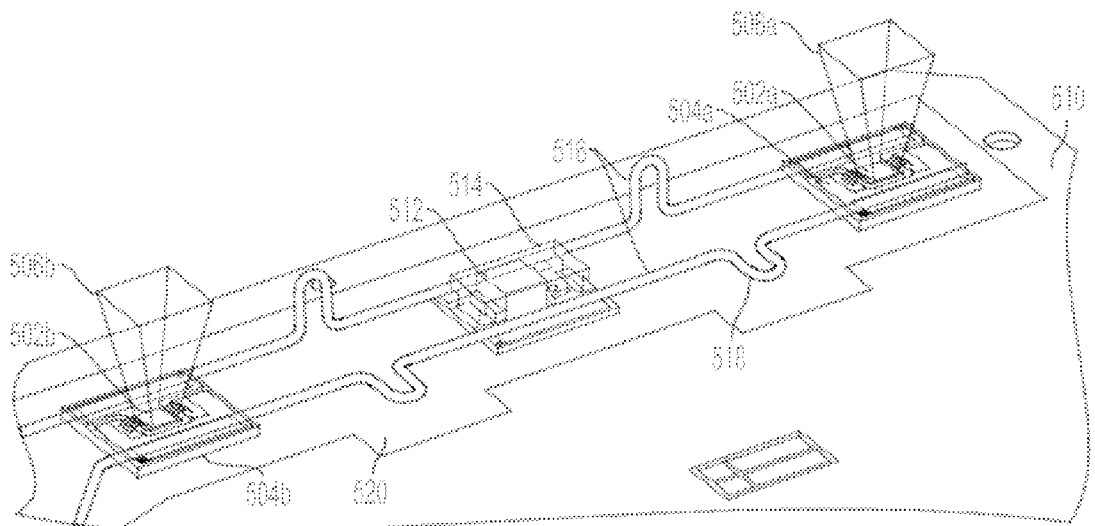
FIG. 5 shows an exemplary assembly for mounting a plurality of photovoltaic assemblies.

FIG. 5 shows an exemplary assembly 500 for mounting a plurality of photovoltaic assemblies. Cell package 502a is shown having an associated photovoltaic cell 504a and an associated secondary optic 506a. Cell package 502b is shown having an associated photovoltaic cell 504b and an associated secondary optic 506b. Cell packages 502a and 502b are coupled to the aluminum backplane 510 via exemplary screen-printed dielectric 520. Cell packages 502a and 502b are disposed on the backplane 510 at a location that corresponds to a focal point of their respective secondary optics 506a and 506b when the backplane 501 is perpendicular to solar radiation. In one embodiment, a protection diode 512 is packaged to the backplane in a manner similar to the packaging of cell packages 502a and 502b. The protection diode 512 includes a heat shield 514 that protects the protection diode 512 from heat or dissipates heat from the protection diode 512. In an exemplary embodiment, the heat shield 514 includes a copper strip that covers the protection diode 512 and is soldered to contact pads of the diode package.

Interconnecting wiring 516 provides an electrical connection between cell packages 502a and 502b. In one embodiment, the interconnecting wiring 516 connects printed circuit layers of the cell packages 502a and 502b. The interconnecting wiring 516 includes copper wire that is soldered to electrodes of the cell packages 502a and 502b. The diameter of the wire is selected to handle a current provided by the exemplary cell packages and to reduce internal resistance losses Kinks 518 are introduced into the interconnecting wiring 516 to avoid mechanical stress due to thermal expansion of the interconnecting wiring 516. The interconnecting wiring 516 may be sufficiently rigid to be self-supporting. The interconnecting wiring 516 may be affixed to the backplane 510 separated by a separation distance in a range of about 1 millimeter to about 2 millimeters above the surface of the backplane 510. Such a configuration avoids physical contact with the insulating dielectric or with the aluminum anodized surface.

Figure 6:
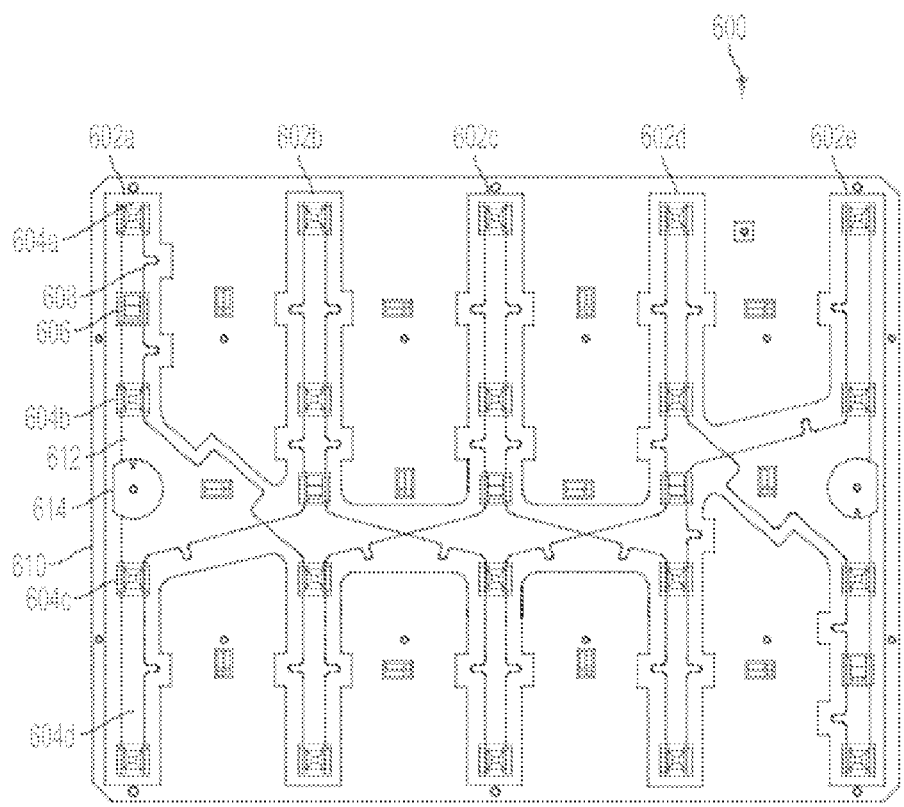
FIG. 6 shows a top view of a solar panel assembly in an exemplary embodiment.

FIG. 6 shows a top view of a solar panel assembly 600 in an exemplary embodiment. The exemplary solar panel assembly 600 includes five tiers 602a-602e of cell packages. In each tier, four cell packages, such as exemplary cell packages 604a-604d, and a protection diode 606 are connected in parallel using the interconnecting wiring 608. The cell packages are coupled to an aluminum backplane 610 via dielectric layer 612. The tiers 602a-602e are connected in series to form a solar panel assembly 600 having 20 cell packages. In various embodiments, the number of cells in parallel vs. the number of cells in series may be selected to achieve a selected current-voltage ratio of the solar panel assembly 600. Having cells wired in parallel (in the tiers) allows one or more cells to fail while maintaining the function of the panel at a reduced power, thereby improving an overall reliability of the solar panel assembly 600. Terminal connections 614 provide electrical coupling from the interconnecting wiring 608 to external circuitry. The interconnect wiring 608 may be soldered to an insulated multi-strand copper external connection wire (not shown) that penetrates the aluminum backplane 610 to an exterior of the solar panel assembly 600 via a strain relief cord grip.

Figure 7:
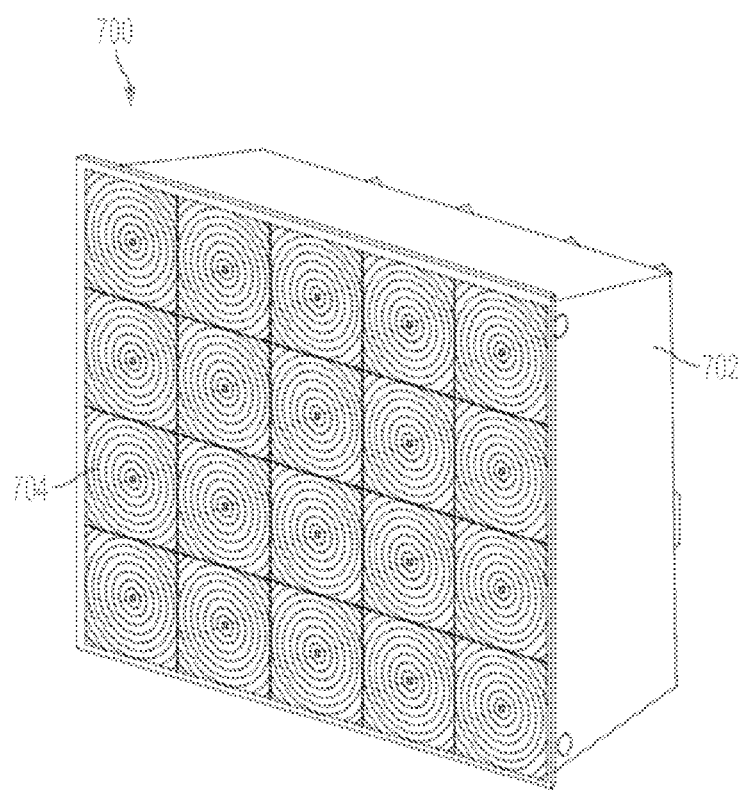
FIG. 7 shows an exemplary solar panel package of the present disclosure.

FIG. 7 shows an exemplary solar panel package 700 of the present disclosure. The exemplary solar panel package 700 includes an enclosure 702 that encloses a solar panel assembly (not shown) having one or more cell packages according to the present disclosure. A lens 704 such as a Fresnel lens is coupled to a top of the enclosure 702 using an adhesive, to enclose the solar panel assembly. In various embodiments, the adhesive includes a silicone adhesive. Filtered vents are provided in the enclosure 702 to equalize pressures between an interior and an exterior of the enclosure 702 and to allow moisture within the enclosure to escape to an exterior of the enclosure 702.

Figure 8:
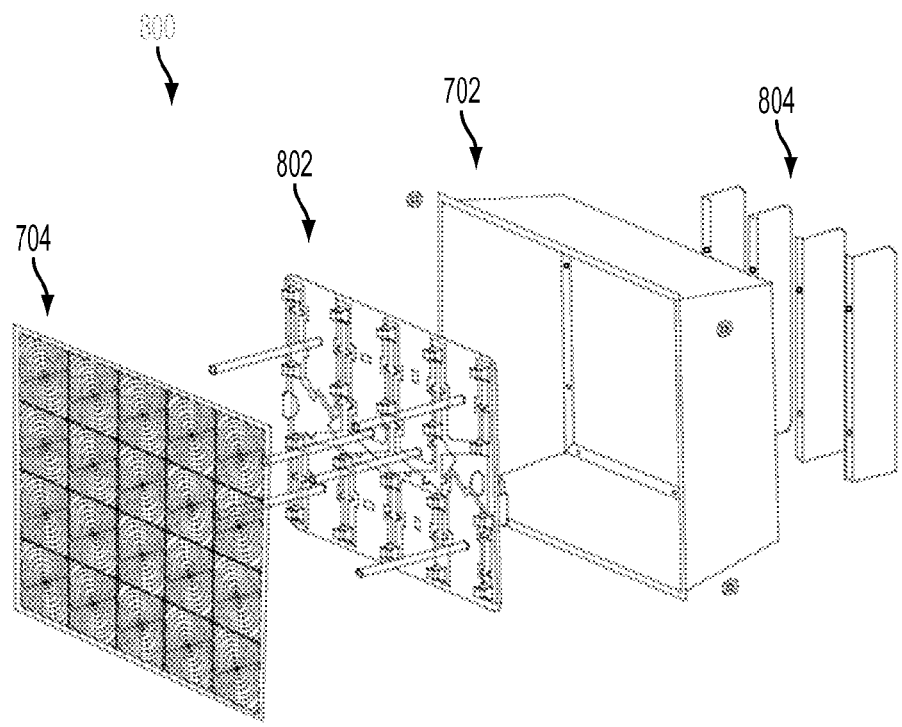
FIG. 8 shows an exploded view of the solar panel package of FIG. 7.

FIG. 8 shows an exploded view 800 of the solar panel package 700 of FIG. 7. The exploded view 800 shows the enclosure 702 and the Fresnel lens 804. Additionally, the exploded view 800 shows the solar panel assembly 802 that includes a number of cell packages and resides in a chamber formed by the enclosure 702 and the Fresnel lens 704. The enclosure 702 may further include one or more cooling fins 804 to aid in the dispersion of heat from the enclosure 802 and thus from the solar panel 802.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated The flow diagrams depicted herein are just one example. There may be many variations to this diagram or the steps (or operations) described therein without departing from the spirit of the disclosure. For instance, the steps may be performed in a differing order or steps may be added, deleted or modified. All of these variations are considered a part of the claimed disclosure.

While the exemplary embodiment to the disclosure had been described, it will be understood that those skilled in the art, both now and in the future, may make various improvements and enhancements which fall within the scope of the claims which follow. These claims should be construed to maintain the proper protection for the disclosure first described.

What is claimed is:

1. A method of dissipating heat from a photovoltaic cell, comprising:
    forming a cell package by:
        providing a coating layer in contact with the photovoltaic cell,
        sandwiching a solder mask between the coating layer and a first thermally conductive layer,
        sandwiching an electrically isolating layer between the first thermally conductive layer and a second thermally conductive layer;
        wherein the first thermally conductive layer reduces a density of received heat from the photovoltaic cell and conducts the heat to the second thermally conductive layer via the electrically isolating layer; and
    coupling the second thermally conductive layer of the cell package to a thermally conducting backplane via a thermal adhesive layer and an electrically insulating layer, wherein the thermally conducting backplane conducts heat away from the second thermally conductive layer.

2. The method of claim 1, wherein reducing the heat density in the first thermally conductive layer further comprising spreading heat over a lateral area of the first thermally conductive layer.

3. The method of claim 1 further comprising conducting electricity from the photovoltaic cell in the first thermally conductive layer.

4. The method of claim 1, wherein the first thermally conductive layer further comprises at least one of copper, aluminum, iron, chrome, nickel, molybdenum, zinc, silver, gold and tin.

5. The method of claim 1, wherein the first thermally conductive layer and second thermally conductive layer maintain an operating temperature of the photovoltaic cell at or below about 110° C.

6. The method of claim 1, wherein the first thermally conductive layer, second thermally conductive layer and electrically isolating layer are selected to prevent an electrical breakdown at a voltage up to about 1700 volts.

7. A method of operating a photovoltaic cell assembly, comprising:
    receiving heat from a photovoltaic cell at a first thermally conductive layer;
    reducing a density of the received heat at the first thermally conductive layer;
    transferring the heat from the first thermally conductive layer to a second thermally conductive layer via an electrically isolating layer that thermally couples the first thermally conductive layer to the second thermally conductive layer; and
    conducting heat from the second thermally conductive layer to a thermally conducting backplane via a thermal adhesive layer and an electrically insulating layer.

8. The method of claim 7 further comprising concentrating solar rays at the photovoltaic cell using a solar concentrator.

9. The method of claim 7 further comprising spreading heat received from the photovoltaic cell over a lateral area of the first thermally conductive layer to reduce the heat density and conducting electricity from the photovoltaic cell in the first thermally conductive layer.

10. The method of claim 7, wherein the first thermally conductive layer includes a printed circuit layer, further comprising electrically coupling the printed circuit layer to an electrode of the photovoltaic cell.

11. The method of claim 10 further comprising electrically coupling the printed circuit layer to the electrode of the photovoltaic cell via at least one of: a ribbon bond and a wire bond.

12. The method of claim 10 further comprising coupling the printed circuit layer to another photovoltaic cell assembly.

13. The method of claim 7, wherein the first thermally conductive layer further comprises at least one of copper and aluminum, iron, chrome, nickel, molybdenum, zinc, silver, gold and tin.

14. A method of generating electricity from a solar panel, comprising:
    coupling a plurality of photovoltaic cell assemblies via at least one wire;
    wherein a photovoltaic cell assembly selected from the plurality of photovoltaic cell assemblies includes:
        a photovoltaic cell,
        a first thermally conductive layer configured to receive heat from the photovoltaic cell and reduce a density of the received heat,
        a second thermally conductive layer configured to conduct heat from the first thermally conductive layer to a surrounding environment, and
        an electrically isolating layer configured to thermally couple the first thermally conductive layer and the second thermally conductive layer, wherein the first thermally conductive layer, the electrically isolating layer and the second thermally conductively layer are press bonded to each other;
    conducting heat away from the selected photovoltaic cell via the first thermally conductive layer, the electrically isolating layer and the second thermally conductive layer; and
    conducting heat from the second thermally conductive layer to a thermally conducting backplane via a thermal adhesive layer and an electrically insulating layer.

15. The method of claim 14 further comprising connecting the plurality of photovoltaic cells to achieve a selected current/voltage ratio.

16. The method of claim 14, wherein the thermally conductive backplane includes at least one fin for drawing heat from the backplane.

17. The method of claim 14 further comprising enclosing the solar panel in an enclosure that includes a Fresnel lens.

* * * * *